United States Patent [19]
Arbel et al.

[11] 4,297,679
[45] Oct. 27, 1981

[54] CIRCUIT FOR CONTINUOUS CONVERSION OF SIGNALS INTO DIGITAL MAGNITUDES

[75] Inventors: Arie Arbel, Haifa, Israel; Rainer Kurz, Jülich, Fed. Rep. of Germany

[73] Assignee: Kernforschungsanlage Jülich Gesellschaft mit beschränkter Haftung, Jülich, Fed. Rep. of Germany

[21] Appl. No.: 927,842

[22] Filed: Jul. 25, 1978

Related U.S. Application Data

[63] Continuation of Ser. No. 541,931, Jan. 17, 1975.

[30] Foreign Application Priority Data

Jan. 17, 1974 [DE] Fed. Rep. of Germany ....... 2402072

[51] Int. Cl.³ .......................................... H03K 13/02
[52] U.S. Cl. ............................................. 340/347 AD
[58] Field of Search ................................ 340/347 AD

[56] References Cited
U.S. PATENT DOCUMENTS

| | | | |
|---|---|---|---|
| 3,187,325 | 6/1965 | Waldhaver | 340/347 M |
| 3,311,910 | 3/1967 | Doyle | 340/347 M |
| 3,329,950 | 7/1967 | Shafer | 340/347 M |
| 3,587,089 | 6/1971 | Elliott | 340/347 M |
| 3,644,924 | 2/1972 | Kitagushi et al. | 340/347 M |
| 3,882,484 | 5/1975 | Brokaw | 340/347 AD |

*Primary Examiner*—Thomas J. Sloyan
*Attorney, Agent, or Firm*—Becker & Becker, Inc.

[57] ABSTRACT

A control circuit for a continuous conversion of information carrying analogous voltage and current signals into digital magnitudes containing said information, the respective digital magnitude is so coded that always one digital magnitude differs from the next higher digital magnitude merely by a one-digit digital information value. The circuit of the invention is characterized primarily in that for a simultaneous reception of the signals there are provided one or more serially arranged analogous digital converters as well as control stages comprising one or more groups, while the groups for folding the signals are formed by differential converters which emit the folded signals at the exit of the respective group and while an analogous digital converter follows the control stage or stages. The analogous digital converter forms informational values of the digital magnitudes by a subdivision of the signals.

12 Claims, 6 Drawing Figures

CIRCUIT FOR CONTINUOUS CONVERSION OF SIGNALS INTO DIGITAL MAGNITUDES

This is a continuation of application Ser. No. 541,931, filed Jan. 17, 1975.

The present invention relates to a circuit for a continuous conversion of information-carrying analogous voltage and current signals into digital magnitudes containing said information, respective digital magnitudes being so coded that always one digital magnitude differs from the next higher digital magnitude merely by a one-digit digital informational value.

Circuits for a continuous conversion of information-carrying analogous voltage or current signals into digital electrically or electronically measureable magnitudes are among others employed in the communicational technique, for instance during television transmission over long distances where only a limited energy is available for radiation, and in connection with which it is important to transmit the analogous signals which are the carriers of information. This transmission should be as free as possible from interfering underground signals and thus should be effected with a highly favorable signal/noise ratio. An example for such a transmission in which the above mentioned circuits will be employed are television transmissions of a picture transmitted from the moon.

As a further field of application for circuits of the above mentioned type may be mentioned the field of data processing, especially where analogous signals furnished by an emitter have to be fed into a digitally operating calculator for direct evaluation. The circuits serve in this connection for converting the voltages or currents furnished by the emitter into digital magnitudes which are further evaluated directly by the calculator.

Circuits for a continuous conversion of analogous signals into digital magnitudes are employed also when checking fast electrical operations occurring only once. These circuits must be in a position to transmit the analogous signals with great band width which is possible only when the circuit transmits as many informational values as possible in a minimum of time.

Circuits for a continuous conversion of analogous signals into digital magnitudes are known as synchronously working serial analogous digital converters. A circuit of this type has become known from U.S. Pat. No. 3,187,325 according to which the conversion of the fed-in signals into digital magnitudes is effected by means of stages consisting of a linear amplifier. In each stage the voltage value of which has been reached there is furnished a one-digit digital informational value of the digital magnitudes which informational value is designed as a "bit". The first stages furnish the highest value bit, the second stages furnish the next lower bit, etc. In order to prevent the digital magnitudes which likewise change when the analogous signals are sent into the circuit change, from assuming an undetermined value during this change, the digital values are coded in the so-called gray code in which each time one digital magnitude differs with regard to the next higher digital magnitude always only by one bit. The drawback of this known circuit is seen in the fact that the precision of the digital magnitudes and thus the precision of the conversion of the analogous signals is dependent on the number of the stages, which means on the number of the linear amplifiers, because in each stage only one bit is generated. The higher the number of the stages, at a lower speed, therefore, the signals will be converted into digital magnitudes and the smaller will be the band width which will be available for the transmission.

There is furthermore known under the name "Direct Method" a parallel working analogous digital converter which consists of a circuit comprising a plurality of parallelly arranged comparators. An analogous signal sent into the analogous digital converter is processed simultaneously by all parallelly arranged comparators whereby a transmission with a high band width will be realized. The precision at which a signal is converted into digital magnitudes is, however, dependent on the number of parallelly arranged comparators. Thus, in order to realize a sufficiently high precision of the conversion, a considerably voluminous apparatus is required. The precision of the digital magnitudes formed by the conversion of the analogous signal is additionally affected by the fact that the voltage ranges of the individual comparators can be fixed only within certain tolerance limits and furthermore a precise adjustment of many parallelly arranged comparators can be realized only under difficulties.

It is an object of the present invention to provide a circuit for a continuous conversion of information carrying analogous voltage or current signals into digital magnitudes containing said information, which circuit will make it possible to convert analogous signals with a high band width and with great precision in a continuous manner.

It is a further object of this invention to provide a circuit as set forth in the preceding paragraph which circuit can be produced without a voluminous apparatus while the required adjustment of individual circuit elements will be considerably reduced.

It is still another object of this invention so to design the above mentioned circuit that it can be built up as far as possible with integrable circuit elements while as far as possible only a few different integrated circuit elements are to be employed.

These and other objects and advantages of the invention will appear more clearly from the following specification in connection with the accompanying drawings, in which.

Figure 1:
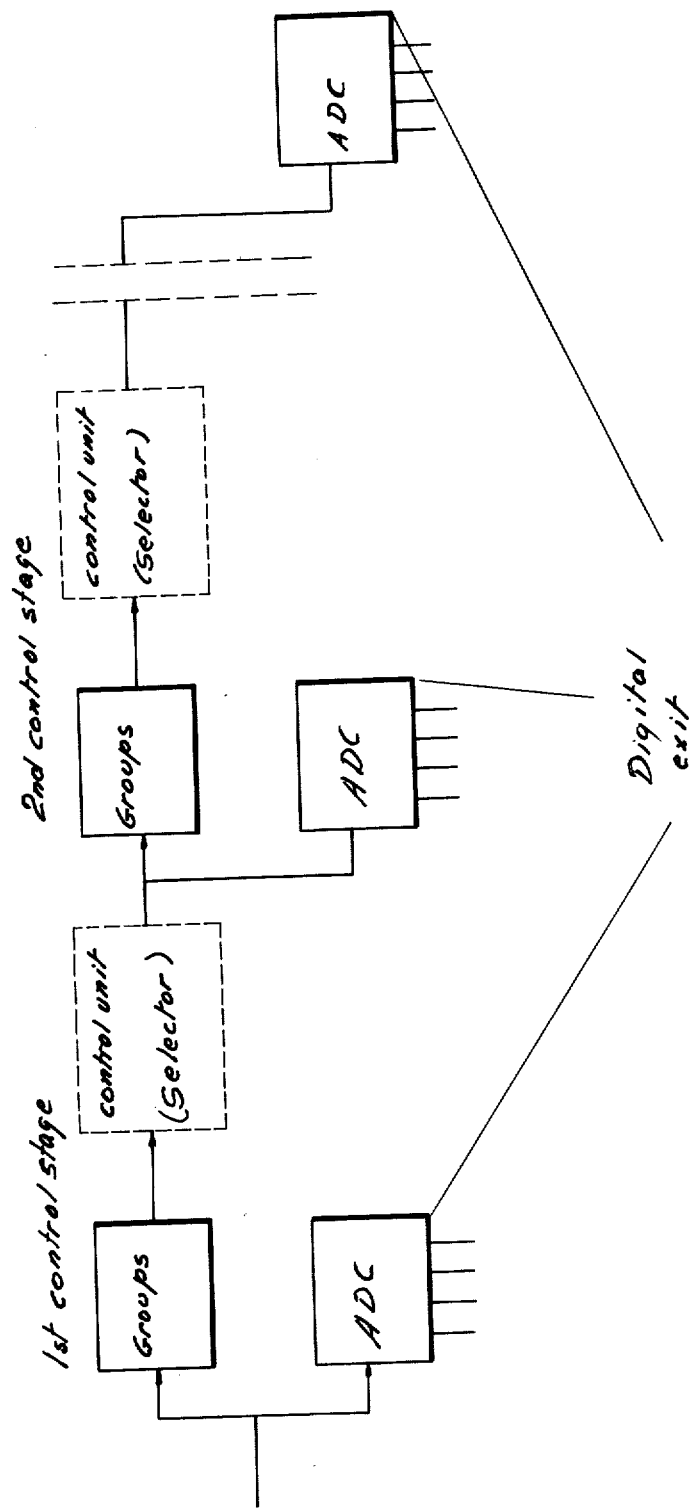
FIG. 1 is a block picture of an embodiment of the circuit according to the invention.

The circuit according to the present invention is characterized primarily in that for simultaneously receiving the signals there are provided one or more serially arranged analogous digital converters and control stages comprising one or more groups while the groups for folding the signals are formed by differential converters which emit the folded signals at the exit of the respective group and while an analogous digital converter follows the control stage or stages, said analogous digital converter forming informational values of the digital magnitudes by a subdivision of the signals.

For purposes of forming digital magnitudes of high precision, according to the present invention a plurality of serially arranged control stages are employed. In this connection serially and also parallelly working analogous digital converters may be used. The digital magnitude is, for instance, when employing an analogous digital converter, composed of parallelly arranged comparators formed for an incoming signal by the fact that simultaneously to the highest value informational values of the digital magnitude which are generated in the analogous digital converter of the first control stage at high speed, the signal is folded in the groups of the first control stage which group is formed by differential amplifiers. The signal is in the analogous digital converter of the next control stage likewise at high speed converted into the next lower informational values of the digital magnitude. The folded signal is once folded in the groups of the second circuit stage and digitalized in the analogous digital converter of the next circuit stage. By employing analogous digital converters with a limited number only of parallelly arranged comparators, a precise conversion of the analogous signals will be assured and the volume of the apparatus will be kept low. In this connection, it is advantageous when the group provided in one circuit stage for selection of the voltage or current is followed by a control unit formed of selectors. A particularly advantageous embodiment of the circuit according to the invention consists in that in the groups the bases intended for receiving the signals or the folded signals, of each two bases of the transistors, the emitter coupled transistors forming the differential amplifiers of a group are connected to each other and in that the bases of the second transistors are biased by voltages which differ from the differential amplifier to differential amplifier of the group by the same voltage amount while to the bases of the second transistors of the respective first differential amplifier of one group a voltage is applied which, when employing n groups in one control stage differs each time by 1/n from the voltage prevailing at the base of the second transistor of the first differential amplifier of the first group.

According to a further feature of this advantageous embodiment of the invention, the collectors of the transistors forming the differential, which collectors follow each other in alternating sequence, form the two exits of the respective group.

A further very advantageous modification of the invention consists in that the differential amplifiers forming one group are arranged in series in such a way that the interconnected emitters of the two transistors of a differential amplifier are respectively connected to the collector of one of the two transistors of the following differential amplifier and that the bases of each one of two emitter coupled transistors which form the differential amplifiers of a group are interconnected through resistors while the signals or as the case may be, the signals folded in the preceding control stage are entered at the base of the first one of the interconnected transistors, and while a constant voltage through resistors prevails at the base of the last one of the differential amplifiers arranged in series. The collectors of the differential amplifiers, which collectors are not connected with the emitters of the respective preceding differential amplifiers of the series in alternating sequence, form the two exits of the respective group.

It is also expedient that, if desired, for purposes of linearizing the folded signals emitted by the respective groups composed of differential amplifiers, the collectors of the differential amplifiers which collectors form the exit of a group and are interconnected, are through diodes connected to a voltage of operation.

It is likewise very advantageous when the selectors which form the control unit for the selection of the voltage consist of a differential amplifier formed by two emitter coupled transistors, and when the collectors of the two transistors are connected to the voltage of operation, and the exit of the selectors is connected to the interconnected emitters of the transistors, and when the selectors forming the control unit for the selection of the current consists of two current amplifiers each of which is formed by two base and emitter coupled transistors while the two inlets of the selectors are respectively connected to the two bases of the current amplifiers. The two current amplifiers are arranged in series in such a way that the collector of one of the two transistors forming the current amplifier, which collector serves as exit of one of the current amplifiers, is connected to the interconnected emitters of the other current amplifier. That one of said current amplifier which serves as exit of one of the two transistors forming the current amplifier forms the exit of the selector. The two interconnected emitters of the current amplifier serving as exit are through a diode connected to a reference voltage. It is also advantageous if a comparator is arranged in parallel to the bases of the transistors of the differential amplifier of the selectors forming the control unit for the selection of the voltage. It is furthermore advantageous when a comparator is arranged in parallel to the diode which is connected to the two emitters of the current amplifier serving as exit. Due to the comparators added to the voltage or current selectors of a control unit, in addition to the digital magnitudes formed in the analogous digital converters, further digital information is obtained.

It has been found that the employment of the circuit according to the invention is advantageous for various fields of employment where it is of importance to collect and evaluate the information obtained in short measuring intervals. The employment of the circuit according to the invention permits or creates additional measuring and checking possibilities. Thus, it is possible for instance when employing the circuit according to the invention, for investigating the composition of materials, to materially increase the measuring speed of spectrometers by effecting the excitation by means of a highly intensive Laser beam of a duration of less than 1 $\mu$/sec. The measuring system is by means of the circuit according to the invention connected to a process calculator. Such fast spectrometers are as measuring feelers of great importance in connection with technical processes. Thus, objects can be marked by the addition of trace elements and can by spectrometric methods be identified quickly and safely.

Referring now to the drawings in detail, a signal in the first control stage (see FIG. 1) is received simultaneously by the groups formed by n differential amplifiers and by the analogous digital converter. While in the analogous digital converter the signal is by coarse division converted into the high value information values of the respective digital magnitudes, the signal is folded in the groups and the folded voltage or current signal is selected in the selectors which may follow said groups and as the case may be may be linearized. Inasmuch as the folded signal leaving the first control stage is in the next control stage parallely received by the analogous digital converter and by the groups of the next control stage, while in the analogous digital converter the next lower informational values of the next digital magnitude are formed and in the groups the received folded signal is folded once more and is conveyed to a next control stage which may follow, for forming the next lower informational values of the digital magnitude. The last control stage is followed by analogous digital converters for ascertaining the lowermost information values of the digital magnitude.

Figure 2:
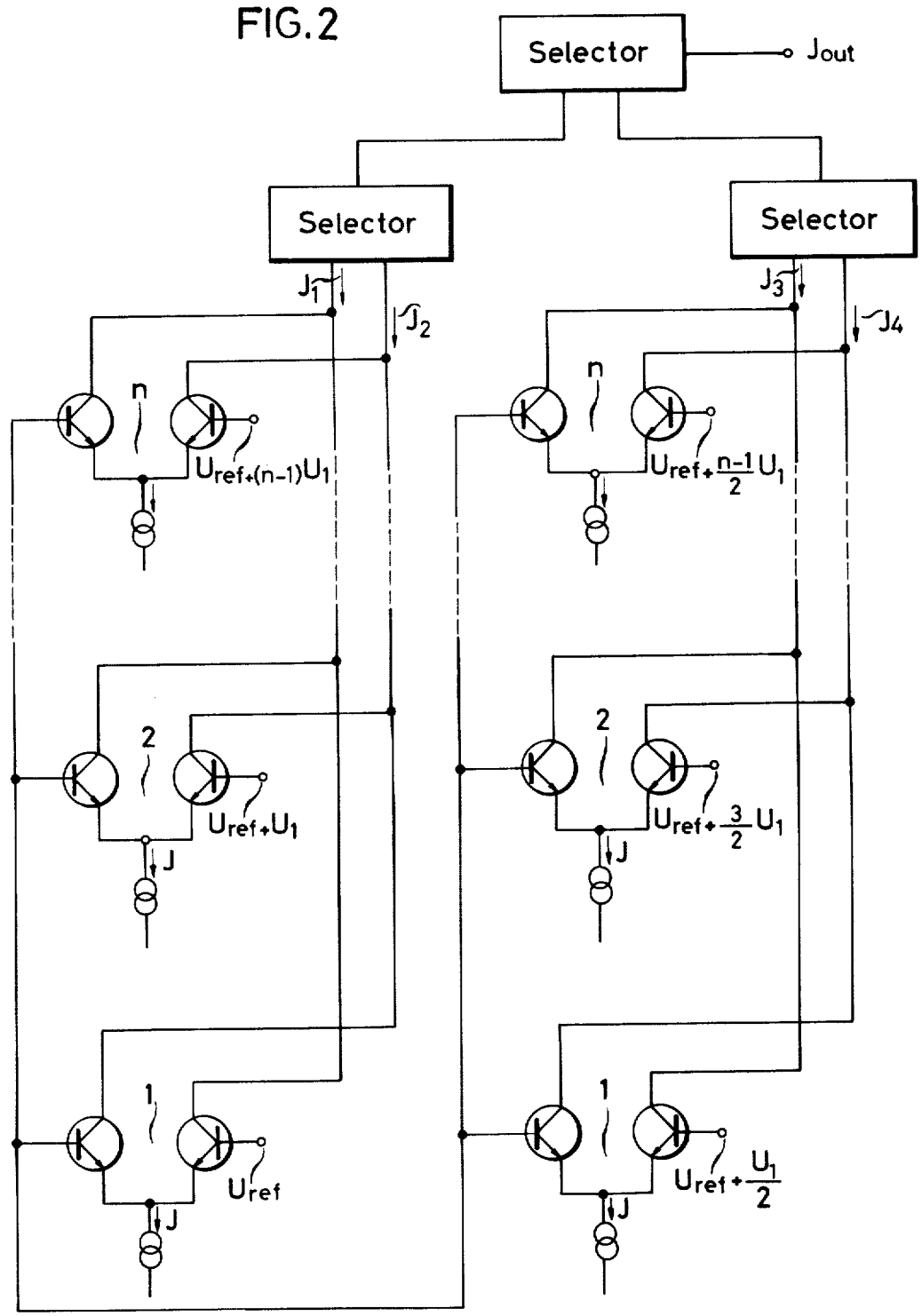
FIG. 2 shows an embodiment of two groups formed of differential amplifiers with a following circuit unit formed of selectors.

FIG. 2 illustrates two groups of a control stage formed of n differential amplifiers. These two groups are followed by a control unit formed of selectors. As will be evident from FIG. 2, the signal designated $U_{in}$ is respectively conveyed to the bases of one of two emitter coupled transistors which form the differential amplifiers. The other bases of the emitter coupled transistors are biased to different voltages and more specifically starting in the group 1 with $U_{ref}$ by $U_1$ higher and in the group 2 beginning with $U_{ref}+U_1/2$ likewise by $U_1$ higher. The currents emitted by the collectors which are connected in alternating sequence, superimpose each other to $I_1$ and $I_2$ in the group 1 and to $I_3$ and $I_4$ in group 2. Due to the crosswise connection of the collectors, the folding of the signal is effected. As will be further evident from FIG. 2, the currents $I_1$ and $I_2$ are conveyed to a selector which follows the group 1, and the currents $I_3$ and $I_4$ are conveyed to a selector following the group 2. In the selector is selected (as not illustrated in FIG. 2) the respective greater or smaller one of the two currents conveyed to the selectors and is as $I_a$ and $I_b$ conveyed to a further selector which selects the respective smaller one of the two currents and conveys the same (as likewise not shown in FIG. 2) to the last control stage or to an analogous digital converter.

Figure 3:
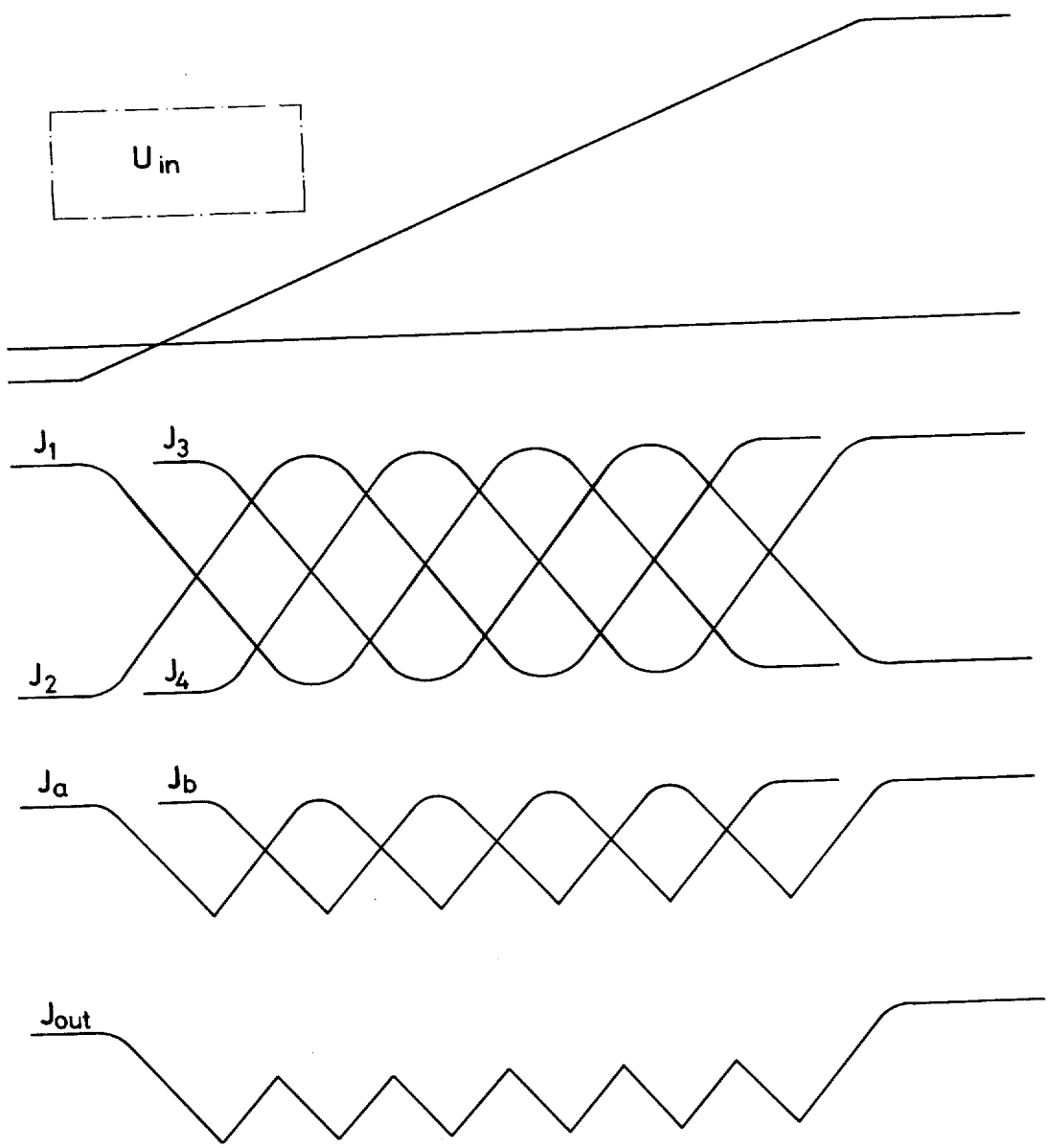
FIG. 3 represents an embodiment of a group formed of differential amplifiers with a following diode for linearizing a folded signal.

In order to explain the action of the selectors following said groups, the explanation will start in FIG. 3 with the course of the voltage of a signal $U_{in}$ which linearly ascends. Therebelow FIG. 3 shows the course of the currents $I_1$ to $I_4$ emitted by the groups. If in the selectors following said groups the respective greater one of the two currents is selected, the selectors emit the currents $I_a$ and $I_b$ with the course illustrated. Inasmuch as in the selector following the two selectors, the respective smaller one of the two introduced currents is selected, it will be appreciated that for $I_{out}$ the course illustrated in the drawing in FIG. 3 is obtained.

Figure 4:
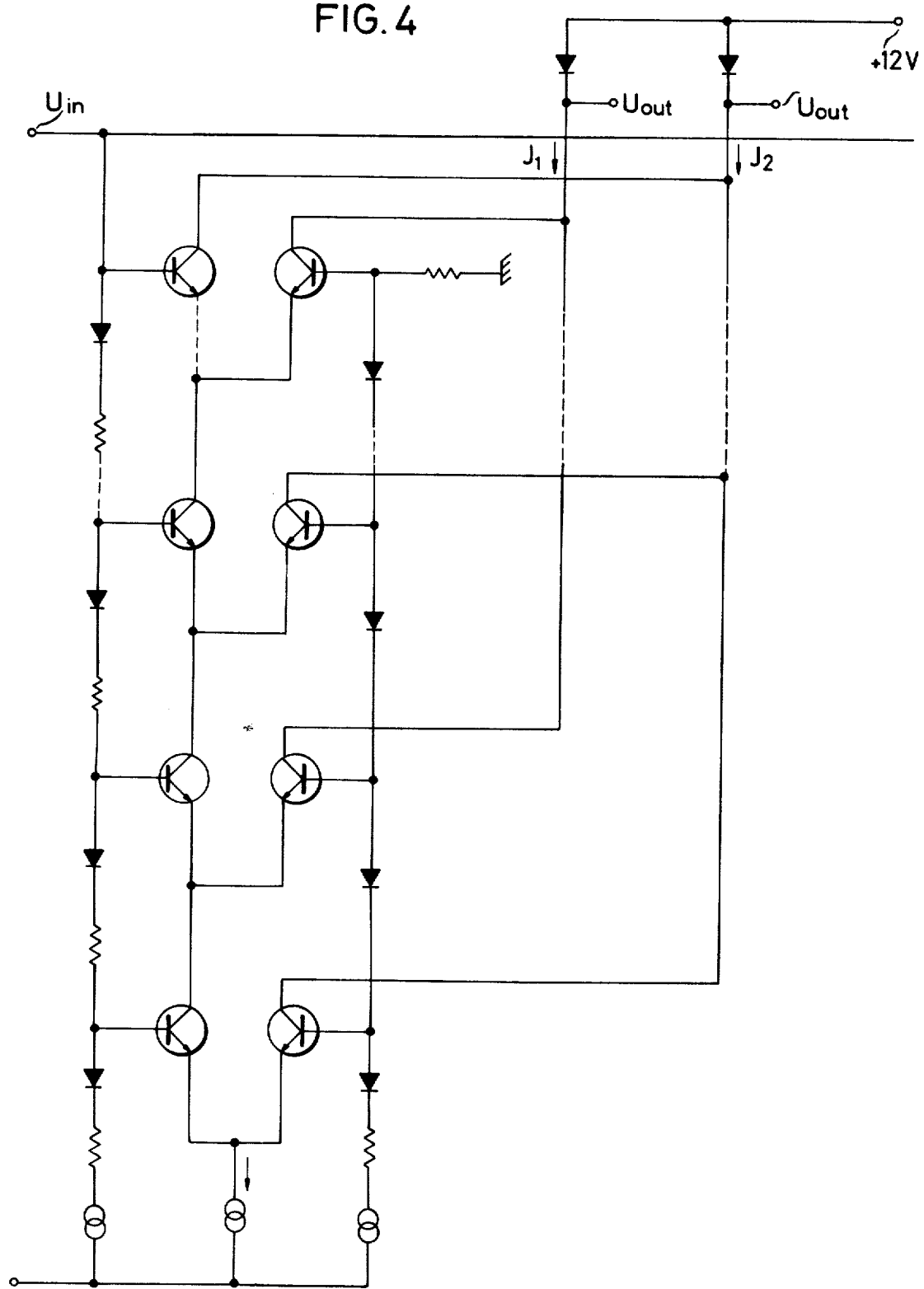
FIG. 4 shows the course of the voltage of a linear increasing signal and also shows the course of the currents of the folded signal which currents are generated by the groups and selectors.

A further embodiment of a group formed by n differential amplifiers with diodes intended for linearization as illustrated in FIG. 4. With this embodiment, the differential amplifiers are arranged in series while the interconnected emitters of the transistors of a differential amplifier is connected respectively to the collector of one of the other transistors of the following differential amplifier. The bases of each one of the differential amplifiers are respectively through diodes and resistors, and the other bases of the differential amplifiers through diodes connected to each other. The interconnected collectors, the crosswise connection of which brings about the folding of the signal are for purposes of realizing the function of the exit voltage of the group with regard to the inlet voltage of the group connected through one diode each of a voltage of operation.

Figure 5:
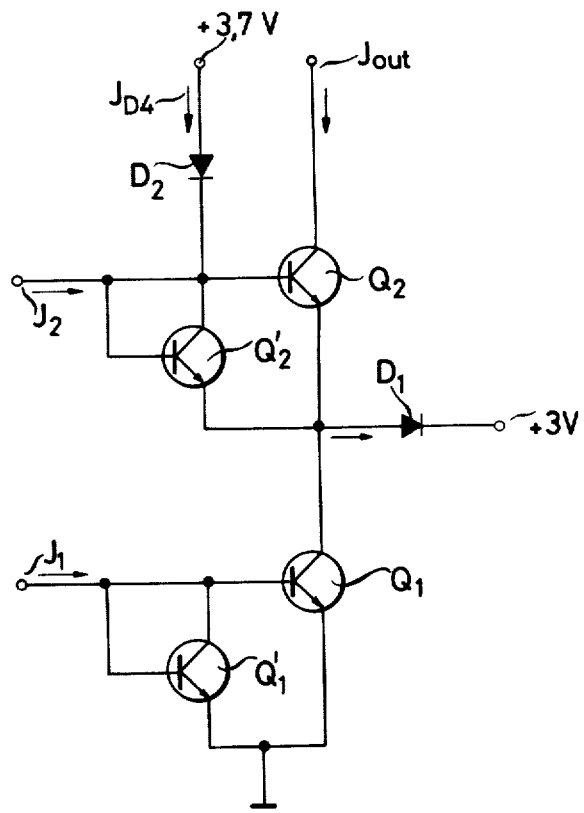
FIG. 5 shows an embodiment of a selector for selecting a voltage.

The selector illustrated in FIG. 5 and serving for selection of the current consists of two current amplifiers respectively formed by two base and emitter coupled transistors. The letters $Q_1Q_1'$ and $Q_2Q_2'$ represent the current amplifiers with preselected bias. The two currents $I_1$ and $I_2$ are respectively conveyed to the two bases of the amplifiers. By the integrated art, the amplification of the respective current amplifier is formed by the size ratio between the two merging zones of the transistors of a current amplifier. The amplification may also be set by resistors arranged in series with the emitters. If, for instance, the amplification of the current amplifier $Q_1Q_1'$, $A_1=2$ and the amplification of the second amplifier $A_2=1$, the greater one of the two input currents of $I_1$ and $I_2$ appears as $I_{out}$.

Figure 6:
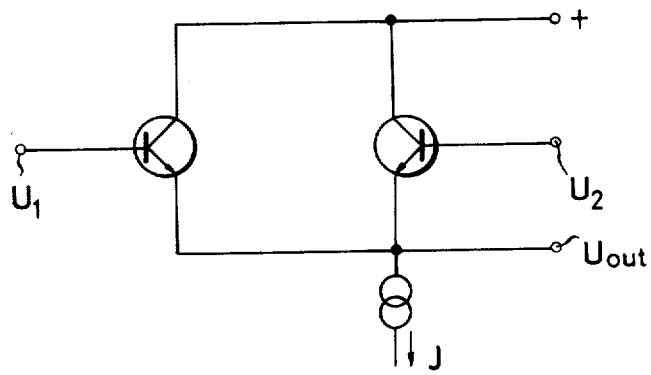
FIG. 6 represents an embodiment of a selector for selecting a current.

The selector illustrated in FIG. 6 for selecting the voltage is built up from a differential amplifier. The two input signals $U_1$ and $U_2$ are applied to the bases. The output signal $U_{out}$ is withdrawn at the two interconnected emitters.

It is, of course, to be understood that the present invention is, by no means, limited to the specific showing in the drawings but also comprises any modifications within the scope of the appended claims.

What we claim is:

1. An apparatus for converting an analog current or voltage signal into a digital representation of that signal, the apparatus consisting of a plurality of stages to receive the signal, each stage comprising an analog-to-digital convertor and each stage preceding the last stage having a group of differential amplifiers with input thereof connected in parallel with the analog-to-digital converter and designed to fold the signal received a plurality of times and a selector control unit receiving the signal from the group and transmitting the signal to the next succeeding stage, each analog-to-digital convertor being designed to output a plurality of digits representing the binary magnitude of the encoded signal with the digits representing the next most significant binary magnitudes from the preceding stage, the final stage being an analog-to-dital convertor designed to output digits representing the least significant binary magnitudes of the encoded signal, all of the digits together forming a complete binary magnitude representation of the encoded signal.

2. A method for converting an analog current or voltage signal into a digital representation of that signal using a circuit to supply the signal in parallel to an analog-to-digital convertor and to a group of at least three differential amplifiers, the convertor and amplifiers together forming a first stage, the steps comprising, first: the analog-to-digital convertor outputting a plurality of digits representing a binary magnitude, the digits in the first stage representing the most significant binary magnitude of the encoded signal; second: the differential amplifiers in the first stage making a plurality of folds in the signal and supplying the folded signal in series to a plurality of selector circuits; third: the selector circuits selecting the signal and supplying the signal in parallel to the analog-to-digital converter and group of amplifiers in each additional stage, with each stage being serially connected to and supplying signals to further selector circuits; fourth: the analog-to-digital converter in each stage outputting a plurality of digits representing the next most significant binary magnitudes from the preceding stage, with the analog-to-digital convertor in the last stage outputting a plurality of digits representing the least significant binary magnitudes of the encoded signal.

3. A circuit for the continuous encoding of electrical signals having a magnitude representative of information bearing voltage or current signals into digital quantities containing said information in the so-called Gray code in which one digital magnitude differs with regard to the next higher or lower digital magnitude always on only one bit, consisting of a combination of circuit stages, each having an input and first and second outputs and consisting of both a group of at least three differential amplifiers providing a repeated folding of the input signals and an analog-to-digital converter, said group and said converter being connected in common to said input and said folded signals being fed to said first output of each stage, the digital quantities produced at the output of the analog-to-digital converters being said second outputs of each stage, the output of the first converter of the first circuit stage representing the most significant magnitude of the information being coded, and the output of each converter of succeeding stages converter representing lessor significant magnitudes; and an analog-to-digital converter connected to receive the first output of the circuit stage of next least significance and providing as its output the least significant magnitude of the information being coded.

4. A circuit according to claim 3, wherein at least two series-connected circuit stages are provided.

5. A circuit according to claim 3, wherein the selectors forming the circuit serving for the voltage selection consist of a voltage amplifier formed of two collector- and emitter-coupled transistors, the two inputs of the selectors ae connected to the two base electrodes of the transistors, and the output is connected to the coupled emitters of the two transistors.

6. A circuit according to claim 3, wherein the selectors forming the circuit serving for the current selection consists of two current amplifiers each formed of two base- and emitter-coupled transistors, the two inputs of the selectors are connected to the two base electrodes of the current amplifiers, the two current amplifiers being so connected in series that the collector electrode of one of the two transistors forming the first current amplifier is serving as the output of the second current amplifier and serving as the output of the selector, and is connected to the interconnected emitter electrodes of the second current amplifier which interconnected emitter electrodes are connected to a reference voltage through a diode.

7. A circuit arrangement in combination according to claim 4, wherein means for processing signals are provided in a circuit stage further comprising a circuit formed of selectors and for providing a first output signal for purposes of voltage selection.

8. A circuit arrangement in combination according to claim 4, wherein means for processing signals are provided in a circuit stage further comprising a circuit formed of selectors for providing a first output signal for purposes of current selection.

9. A circuit arrangement in combination according to claim 7, wherein the differential amplifiers comprise pairs of emitter-coupled transistors and the base electrodes of one transistor of each pair of differential amplifiers receive the signals to be processed, while the base electrodes of the second transistors initially are biased at voltages which differ from differential amplifier to differential amplifier by an equal voltage magnitude, and the base electrodes of further second transistors are biased at voltages which differ by an equal fraction of said voltage magnitude of the bias applied initially, alternate collector electrodes are connected in parallel to one of two outputs and the remaining collector electrodes are connected in parallel to the second of two outputs.

10. A circuit arrangement in combination according to claim 7, wherein the differential amplifiers are connected in series in such manner that the interconnected emitter electrodes of the two transistors of a differential amplifier are connected in each instance to the collector electrode of one of the transistors of the succeeding differential amplifier, and the base electrodes of one of two emitter-coupled transistors forming the differential amplifiers in each instance are connected together through resistors and diodes, the signals, or the signals processed in the preceding circuit stage, being applied to the base electrode of the first of the interconnected transistors, and a constant voltage being applied through resistors to the base electrode of the last series-connected differential amplifiers, and in that those collector electrodes of the differential amplifiers which are not connected to the emitters of the respective preceding differential amplifiers of the series form in alternative sequence the two outputs of the respective group.

11. A circuit arrangement in combination according to claim 8, wherein the differential amplifiers comprise pairs of emitter-coupled transistors and the base electrodes of one transistor of each pair of differential amplifiers receive the signals to be processed, while the base electrodes of the second transistors initially are biased at voltages which differ from differential amplifier to differential amplifier by an equal voltage magnitude, and the base electrodes of further second transistors are biased at voltages which differ by an equal fraction of said voltage magnitude of the bias applied initially, alternate collector electrodes are connected in parallel to one of two outputs and the remaining collector electrodes are connected in parallel to the second of two outputs.

12. A circuit arrangement in combination according to claim 8, wherein the differential amplifiers are connected in series in such manner that the interconnected emitter electrodes of the wo transistors of a differential amplifier are connected in each instance to the collector electrode of one of the transistors of the succeeding differential amplifier, and the base electrodes of one of two emitter-coupled transistors forming the differential amplifiers in each instance are connected together through resistors and diodes; the signal, or the signals processed in the preceding circuit stage, being applied to the base electrode of the first of the interconnected transistors, and a constant voltage being applied through resistors and diodes to the base electrode of the last series-connected differential amplifiers which are not connected to the emitters of the respective preceding differential amplifiers of the series form in alternative sequence the two outputs of the respective group.

* * * * *